(12) United States Patent
Furuta et al.

(10) Patent No.: US 8,866,446 B2
(45) Date of Patent: Oct. 21, 2014

(54) END-OF-DISCHARGE VOLTAGE CORRECTION DEVICE AND END-OF-DISCHARGE VOLTAGE CORRECTION METHOD

(75) Inventors: Kazuhito Furuta, Nagoya (JP); Naoki Hirai, Nagoya (JP); Keita Ikuta, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 493 days.

(21) Appl. No.: 13/328,317

(22) Filed: Dec. 16, 2011

(65) Prior Publication Data

US 2012/0086403 A1 Apr. 12, 2012

Related U.S. Application Data

(63) Continuation of application No. PCT/JP2010/055688, filed on Mar. 30, 2010.

(30) Foreign Application Priority Data

Jun. 29, 2009 (JP) .................................. 2009-153545

(51) Int. Cl.
*H02J 7/00* (2006.01)
*H01M 10/44* (2006.01)
*G01R 31/36* (2006.01)
*H01M 10/39* (2006.01)

(52) U.S. Cl.
CPC ............. *H02J 7/0014* (2013.01); *H02J 7/0029* (2013.01); *Y02E 60/12* (2013.01); *H01M 10/448* (2013.01); *G01R 31/362* (2013.01); *H01M 10/3909* (2013.01); *G01R 31/3658* (2013.10); *H01M 10/441* (2013.10); *H02J 7/0021* (2013.01)
USPC .......................................... 320/134; 320/136

(58) Field of Classification Search
USPC ........................................ 320/132, 134–136
See application file for complete search history.

(56) References Cited

U.S. PATENT DOCUMENTS 6,958,197 B2 * 10/2005 Tamakoshi ...................... 429/62
2012/0041690 A1 * 2/2012 Hirai et al. ...................... 702/30

FOREIGN PATENT DOCUMENTS

| JP | 03-158781 A1 | 7/1991 |
| JP | 05-258779 A1 | 10/1993 |
| JP | 08-050930 A1 | 2/1996 |
| JP | 09-306551 A1 | 11/1997 |
| JP | 2000-048865 A1 | 2/2000 |
| JP | 2000-182662 A1 | 6/2000 |
| JP | 2002-228730 A1 | 8/2002 |
| JP | 2003-288950 A1 | 10/2003 |
| JP | 2008-251291 A1 | 10/2008 |

* cited by examiner

*Primary Examiner* — Richard V Muralidar
(74) *Attorney, Agent, or Firm* — Burr & Brown, PLLC

(57) ABSTRACT

An end-of-discharge voltage correction section subtracts, from an end-of-discharge open voltage, the product I×RO of a discharge current I of a block and an ohmic resistance RO of the block and the product ITD×RP of a discharge current ITD obtained by performing a time delay process on the discharge current and a polarization resistance RP of the block. Then, a resulting value is set as an end-of-discharge voltage VL. The ohmic resistance RO is increased as an equivalent cycle count CY increases, and is increased as a healthy parallel number NPH decreases. An increment ΔCY of the equivalent cycle count CY in each charge/discharge cycle becomes greater as a discharge depth DD increases. The healthy parallel number NPH is derived by multiplying a healthy parallel number NPHR of a reference block by the ratio of a capacity CPR of the reference block to a capacity CPS of a target block.

5 Claims, 6 Drawing Sheets

END-OF-DISCHARGE VOLTAGE CORRECTION DEVICE AND END-OF-DISCHARGE VOLTAGE CORRECTION METHOD

TECHNICAL FIELD

The present invention relates to an end-of-discharge voltage correction device and an end-of-discharge voltage correction method for correcting an end-of-discharge voltage of a parallel-connected unit in which sodium-sulfur battery cells or series-connected units each including series-connected cells are connected in parallel with one another.

BACKGROUND ART

Patent Document 1 and Patent Document 2 relate to correction of a voltage of an end-of-discharge at which discharge of a sodium-sulfur battery is stopped.

In the correction of the end-of-discharge voltage disclosed in the Patent Document 1, an internal resistance is separated into an ohmic resistance and a polarization resistance, and the product of a discharge current and the ohmic resistance and the product of the discharge current having a time delay process performed thereon and the polarization resistance are subtracted from an end-of-discharge open voltage, with a resulting value being set as the end-of-discharge voltage.

In the correction of the end-of-discharge voltage disclosed in the Patent Document 2, the product of an internal resistance and a discharge current is subtracted from an end-of-discharge open voltage, with a resulting value being set as the end-of-discharge voltage. The internal resistance is corrected based on the number of charge/discharge cycles and a healthy parallel number.

PRIOR-ART DOCUMENTS

Patent Documents

Patent Document 1: Japanese Patent Application Laid-Open No. 2008-251291
Patent Document 2: Japanese Patent Application Laid-Open No. 2000-182662

SUMMARY OF THE INVENTION

Problems to be Solved by the Invention

A conventional way of correction of an end-of-discharge voltage involves a problem that an internal resistance is not appropriately corrected and therefore the end-of-discharge voltage cannot be appropriately corrected. This is because, in a conventional technique, the number of charge/discharge cycles and the healthy parallel number may sometimes not accurately reflect the internal resistance.

The present invention has been made to solve the problem, and an object of the present invention is to provide an end-of-discharge voltage correction device and an end-of-discharge voltage correction method for appropriately correcting an end-of-discharge voltage.

Means for Solving the Problems

To solve the above-described problem, a first invention is an end-of-discharge voltage correction device for correcting an end-of-discharge voltage of a first parallel-connected unit in which sodium-sulfur battery cells or series-connected units each including series-connected cells are connected in parallel with one another, the end-of-discharge voltage correction device comprising: a discharge depth deriving section for deriving a discharge depth of the first parallel-connected unit in each charge/discharge cycle; an increment deriving section for deriving an increment of an equivalent cycle count in each charge/discharge cycle, the increment becoming greater as the discharge depth derived by the discharge depth deriving section increases; an equivalent cycle count deriving section for deriving the equivalent cycle count by adding the increment derived by the increment deriving section; an information holding section for holding information indicative of a relationship between an open voltage and a discharge depth; a first absolute depth deriving section for, with reference to the information held by the information holding section, deriving, as an absolute depth, a discharge depth of the first parallel-connected unit corresponding to an open voltage after termination of discharge of the first parallel-connected unit; a second absolute depth deriving section for, with reference to the information held by the information holding section and referred to by the first absolute depth deriving section, deriving, as an absolute depth, a discharge depth of a second parallel-connected unit corresponding to an open voltage after termination of discharge of the second parallel-connected unit, the second parallel-connected unit being connected in series with the first parallel-connected unit; a ratio deriving section for deriving the ratio of a capacity discharged by the second parallel-connected unit from initiation of the discharge until the absolute depth derived by the second absolute depth deriving section is reached with respect to a capacity discharged by the first parallel-connected unit from initiation of the discharge until the absolute depth derived by the first absolute depth deriving section is reached, in a case where it is assumed that a healthy parallel number of the first parallel-connected unit is equal to a healthy parallel number of the second parallel-connected unit; a healthy parallel number deriving section for deriving the healthy parallel number of the first parallel-connected unit by multiplying the healthy parallel number of the second parallel-connected unit by the ratio derived by the ratio deriving section; an ohmic resistance correction section for increasing an estimated value of an ohmic resistance of the first parallel-connected unit as the equivalent cycle count derived by the equivalent cycle count deriving section increases, while increasing the estimated value of the ohmic resistance of the first parallel-connected unit as the healthy parallel number derived by the healthy parallel number deriving section decreases; and an end-of-discharge voltage correction section for: subtracting, from an end-of-discharge open voltage, the product of a discharge current of the first parallel-connected unit and the estimated value of the ohmic resistance of the first parallel-connected unit corrected by the ohmic resistance correction section and the product of the discharge current of the first parallel-connected unit having a time delay process performed thereon and a polarization resistance of the first parallel-connected unit; and setting a resulting value as an end-of-discharge voltage.

A second invention is the end-of-discharge voltage correction device of the first invention, in which the increment deriving section reduces a coefficient of increase of the increment relative to the discharge depth as the discharge depth derived by the discharge depth deriving section increases.

A third invention is the end-of-discharge voltage correction device of the first or second invention, in which the ohmic resistance correction section reduces a coefficient of increase of the estimated value of the ohmic resistance relative to the equivalent cycle count as the equivalent cycle count derived by the equivalent cycle count deriving section increases.

A fourth invention is an end-of-discharge voltage correction method for correcting an end-of-discharge voltage of a first parallel-connected unit in which sodium-sulfur battery cells or series-connected units each including series-connected cells are connected in parallel with one another, the method comprising the steps of: (a) deriving a discharge depth of the first parallel-connected unit in each charge/discharge cycle; (b) deriving an increment of an equivalent cycle count in each charge/discharge cycle, the increment becoming greater as the discharge depth derived in the step (a) increases; (c) deriving the equivalent cycle count by adding the increment derived in the step (b); (d) with reference to information indicative of a relationship between an open voltage and a discharge depth, deriving an absolute depth of the first parallel-connected unit corresponding to an open voltage after termination of discharge of the first parallel-connected unit; (e) with reference to the information referred to in the step (d), deriving an absolute depth of a second parallel-connected unit corresponding to an open voltage after termination of discharge of the second parallel-connected unit, the second parallel-connected unit being connected in series with the first parallel-connected unit; (f) deriving the ratio of a capacity discharged by the second parallel-connected unit from initiation of the discharge until the absolute depth derived in the step (e) is reached with respect to a capacity discharged by the first parallel-connected unit from initiation of the discharge until the absolute depth derived in the step (d) is reached, in a case where it is assumed that a healthy parallel number of the first parallel-connected unit is equal to a healthy parallel number of the second parallel-connected unit; (g) deriving the healthy parallel number of the first parallel-connected unit by multiplying the healthy parallel number of the second parallel-connected unit by the ratio derived in the step (f); (h) increasing an estimated value of an ohmic resistance of the first parallel-connected unit as the equivalent cycle count derived in the step (c) increases, while increasing the estimated value of the ohmic resistance of the first parallel-connected unit as the healthy parallel number derived in the step (g) decreases; and (i) subtracting, from an end-of-discharge open voltage, the product of a discharge current of the first parallel-connected unit and the estimated value of the ohmic resistance of the first parallel-connected unit corrected in the step (g) and the product of the discharge current of the first parallel-connected unit having a time delay process performed thereon and a polarization resistance of the first parallel-connected unit; and setting a resulting value as an end-of-discharge voltage.

Effects of the Invention

In the present invention, the ohmic resistance is accurately corrected, and therefore the end-of-discharge voltage is accurately corrected.

EMBODIMENT FOR CARRYING OUT THE INVENTION

These and other objects, features, aspects and advantages of the present invention will become more apparent from the following detailed description of the present invention when taken in conjunction with the accompanying drawings.

(Module 1102 of Sodium-Sulfur Battery)

Figure 1:
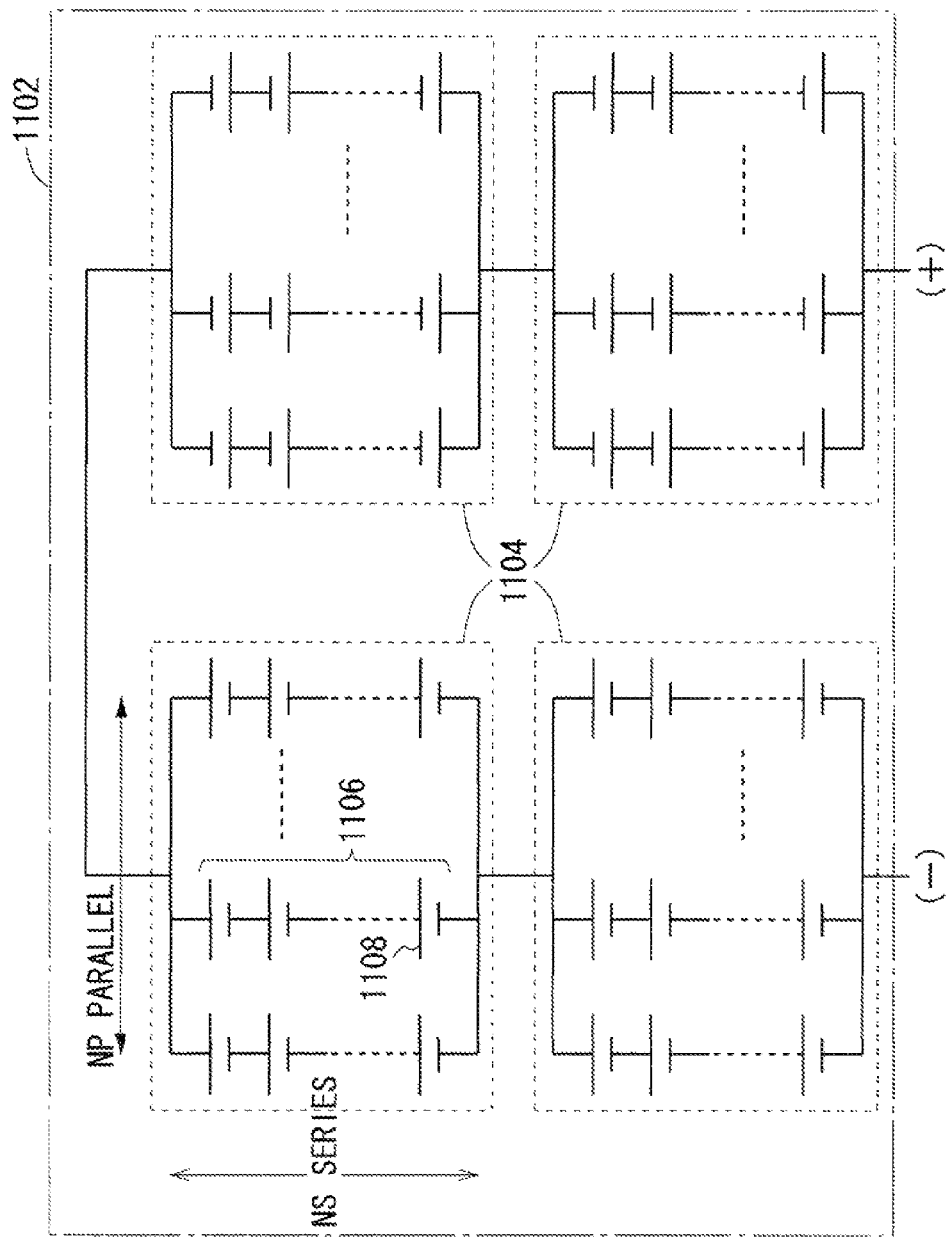
FIG. 1 A circuit diagram of a module.

FIG. 1 is a circuit diagram of a module 1102 of a sodium-sulfur battery. As shown in FIG. 1, the module 1102 is a series-connected unit having blocks 1104 connected in series with one another. The block 1104 is a parallel-connected unit having strings 1106 connected in parallel with one another. The string 1106 is a parallel-connected unit having cells 1108 connected in series with one another.

Although FIG. 1 shows a case where the number of series-connected blocks 1104 is four, the number of series-connected blocks 1104 is increased or reduced in accordance with specifications of a module.

In all the blocks 1104, the numbers NP of parallel-connected strings 1106 are equal. In all the strings 1106, the numbers NS of series-connected cells 1108 are equal. The number NP of parallel-connected strings 1106 and the number NS of series-connected cells 1108 are also increased or reduced in accordance with specifications of a module. Typically, the number NP of parallel-connected strings 1106 and the number NS of series-connected cells 1108 are equal to or greater than two. However, correction of an ohmic resistance RO which will be described later can be performed in a case where the number NS of series-connected cells 1108 is one, that is, in a case where the block 1104 is a parallel-connected unit having the cells 1108 connected in parallel with one another.

(Outline of Control Device 1002)

Figure 2:
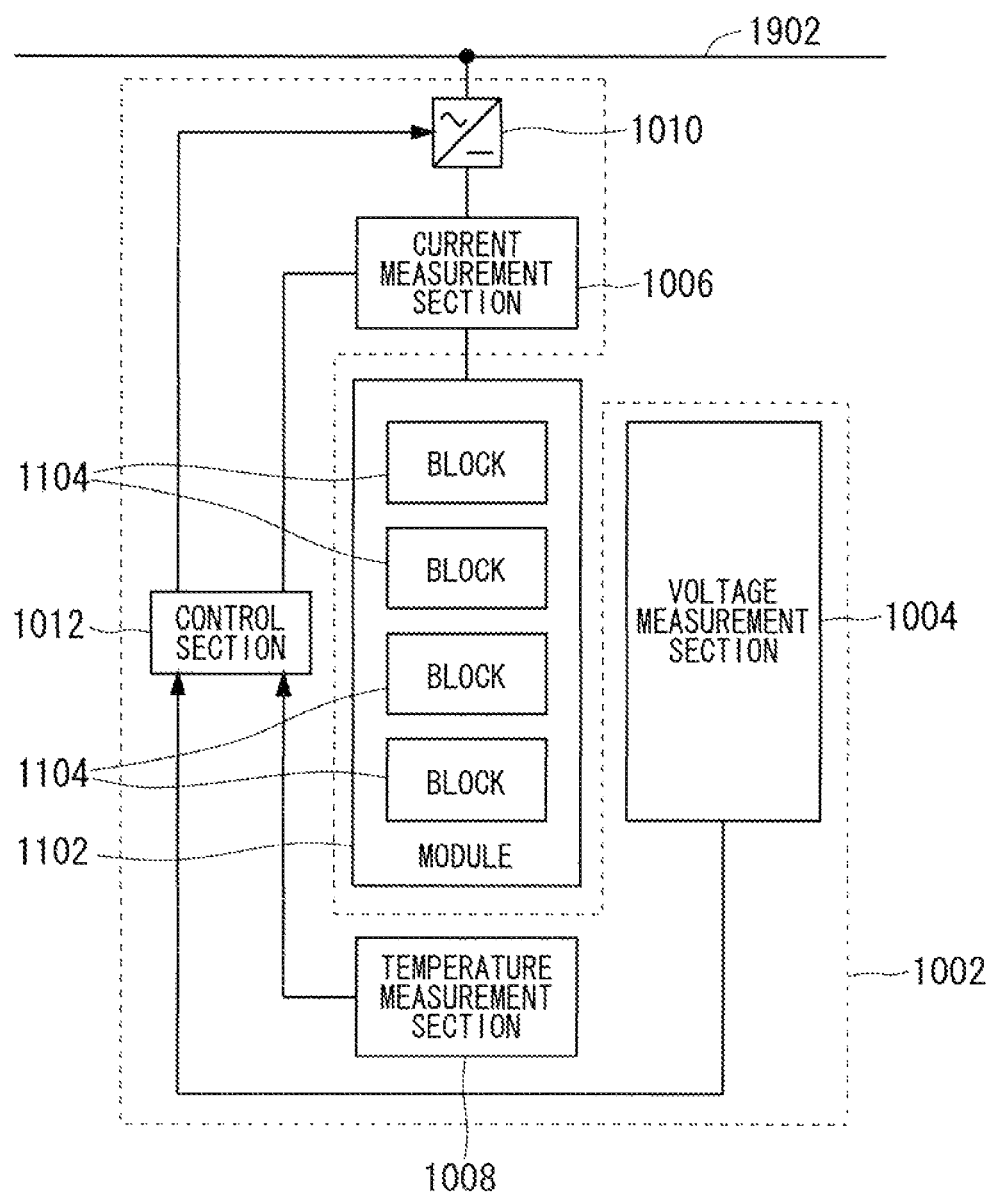
FIG. 2 A block diagram of the module and a control device of the module.

FIG. 2 is a block diagram of the module 1102 and a control device 1002 for controlling the charge/discharge of the module 1102 according to a preferred embodiment. As shown in FIG. 2, the control device 1002 includes: a voltage measurement section 1004 for measuring a voltage of each block 1104; a current measurement section 1006 for measuring a charge/discharge current of the module 1102; a temperature measurement section 1008 for measuring a temperature of each block 1104; a bi-directional converter 1010 for converting DC into AC in a case of power supply from the module 1102 to a power system 1902 while converting AC into DC in a case of power supply from the power system 1902 to the module 1102; and a control section 1012 for obtaining results of measurements from the voltage measurement section 1004, the current measurement section 1006, and the temperature measurement section 1008, and controlling the bi-directional converter 1010. Since the module 1102 is a series-connected unit having the blocks 1104 connected in series with one another, the charge/discharge current of the module 1102 measured by the current measurement section 1006 is considered as the charge/discharge current of the block 1104.

(Stop of Discharge)

When the voltage of the block 1104 obtained from the voltage measurement section 1004 falls below an end-of-discharge voltage VL, the control section 1002 controls the bi-directional converter 1010 to stop the discharge of the module 1102.

(Outline of Control Section 1012)

Figure 3:
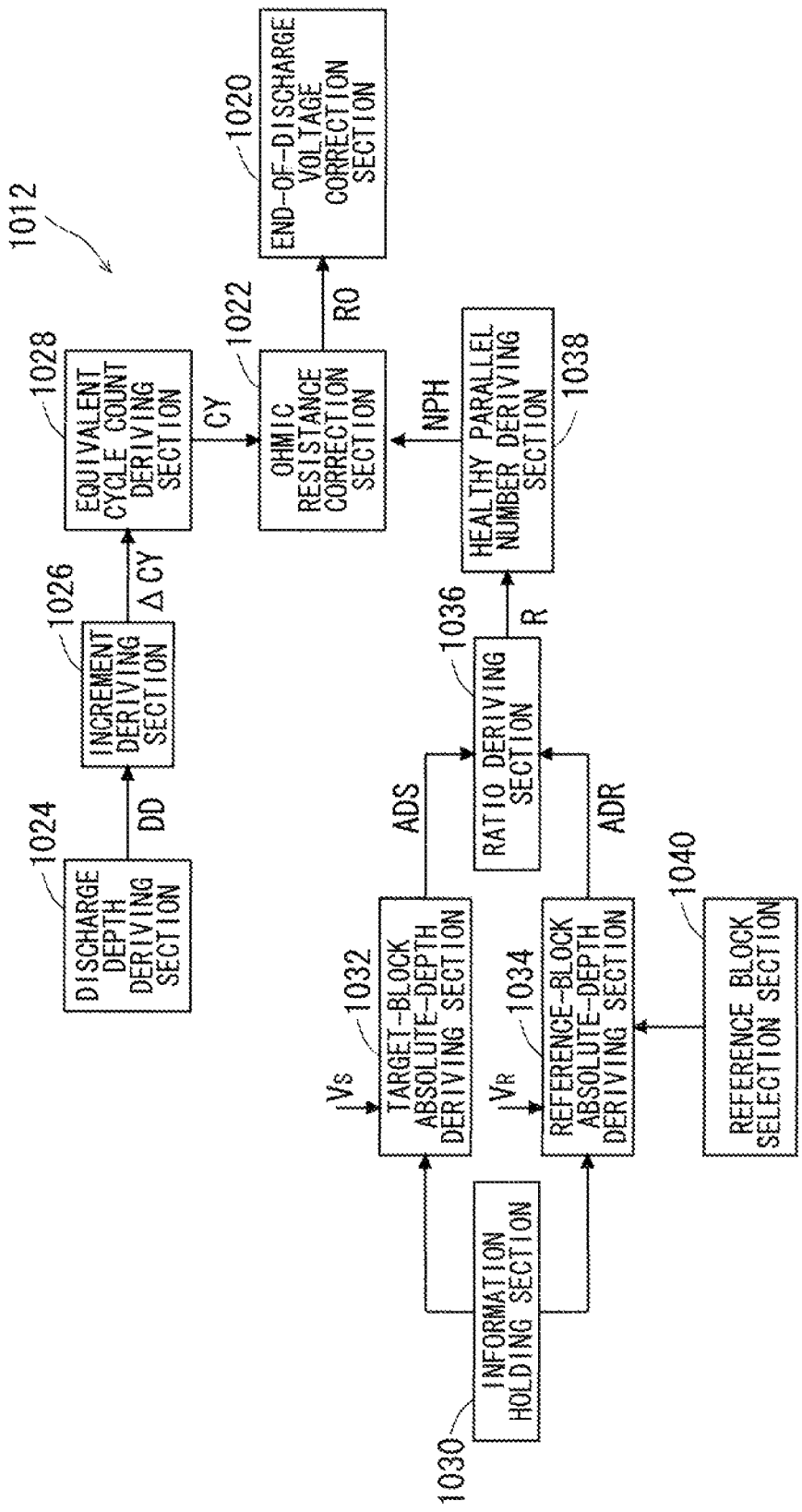
FIG. 3 A block diagram of a control section.

FIG. 3 is a block diagram of the control section 1012. Each of blocks shown in FIG. 3 may be implemented by a program being executed by a built-in computer including at least a CPU and a memory, or alternatively may be implemented by hardware.

(End-of-Discharge Voltage Correction Section 1020)

As shown in FIG. 3, the control section 1012 includes an end-of-discharge voltage correction section 1020 for correcting the end-of-discharge voltage VL. The end-of-discharge voltage correction section 1020 separates an internal resistance R of the module 1102 into an ohmic resistance RO and a polarization resistance RP. In accordance with the formula (1), the end-of-discharge voltage correction section 1020 subtracts, from an end-of-discharge open voltage VLOC, the product I×RO of the discharge current I of the block 1104 obtained from the current measurement section 1006 and the ohmic resistance RO of the block 1104 and the product ITD× RP of the discharge current ITD obtained by performing a time delay process on the discharge current I of the block 1104 and the polarization resistance RP of the block 1104, and sets a resulting value as the end-of-discharge voltage VL.

[Math. 1]

$$VL = VLOC - I \times RO - ITD \times RP \tag{1}$$

The discharge current I is an actual measured value measured by the current measurement section 1006, and is a function of time. The time delay process is a process such as an integration average process and a moving average process with respect to time. The discharge current ITD obtained as a result of the time delay process is a computed value reflecting the previous discharge current I, and is a function of time. The ohmic resistance RO is an estimated value that is estimated based on an equivalent cycle count CY and a healthy parallel number NPH of the block 1104. The polarization resistance RP is a set value.

(Advantage of Correcting End-of-Discharge Voltage VL in Consideration of Polarization Resistance RP)

Figure 4:
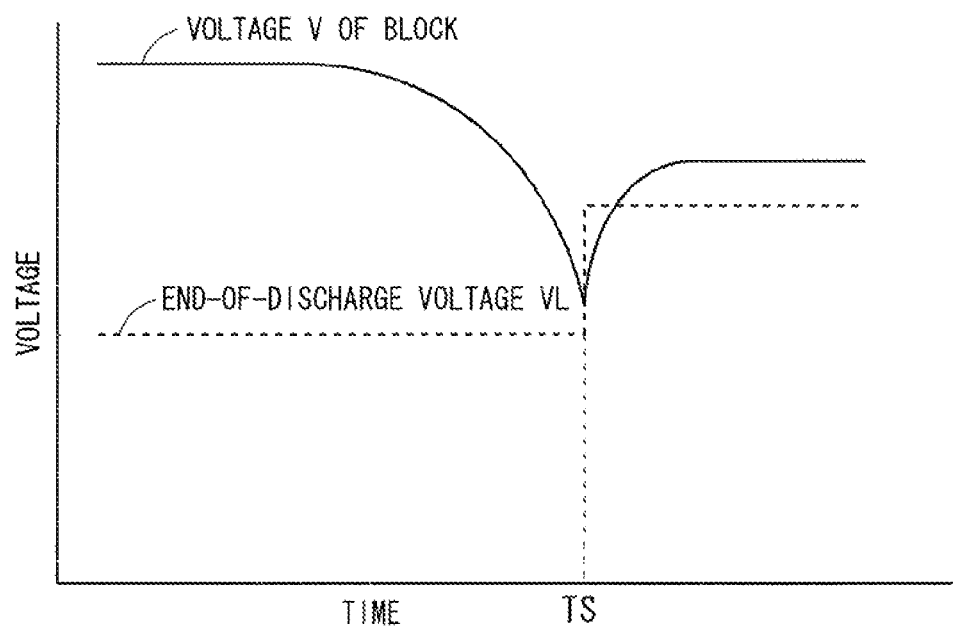
FIG. 4 A diagram for explaining a disadvantage of a case of correcting an end-of-discharge voltage without consideration of a polarization resistance.
Figure 5:
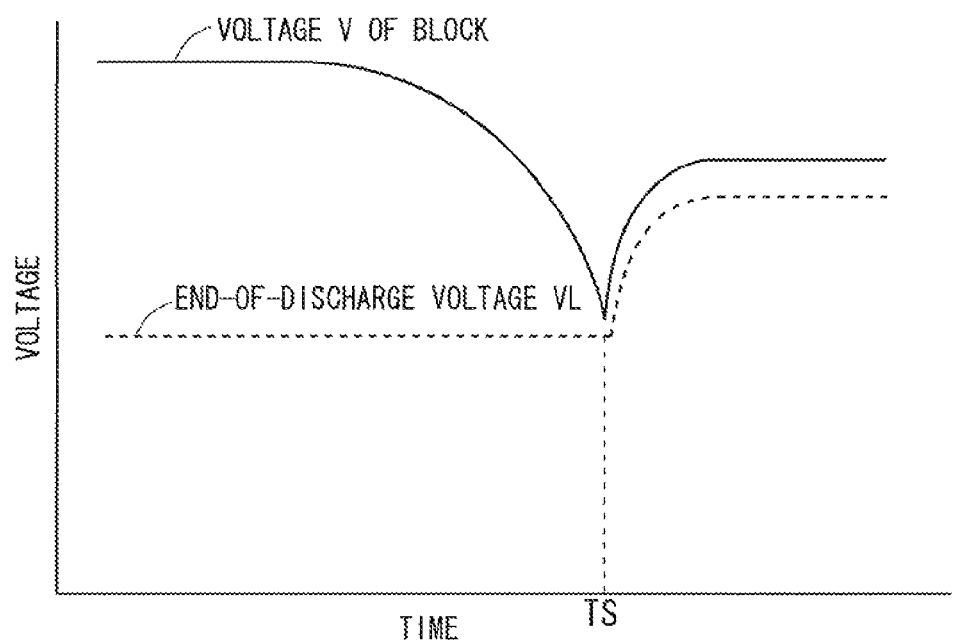
FIG. 5 A diagram for explaining an advantage of a case of correcting an end-of-discharge voltage in consideration of the polarization resistance.
Figure 6:
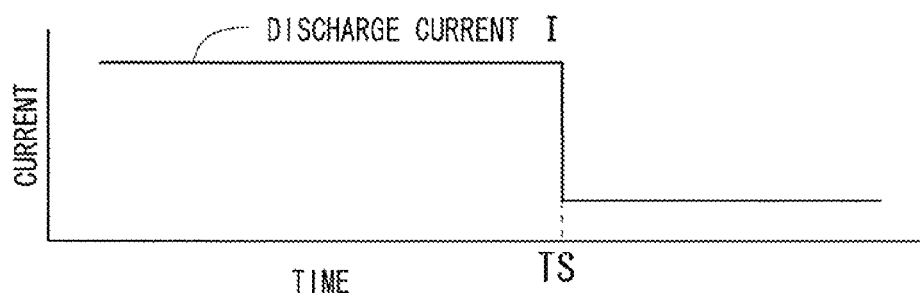
FIG. 6 A diagram showing a change over time of a discharge current.

FIG. 4 is a diagram for explaining a disadvantage of a case of correcting the end-of-discharge voltage VL without consideration of the polarization resistance RP. FIG. 5 is a diagram for explaining an advantage of a case of correcting the end-of-discharge voltage VL in consideration of the polarization resistance RP. FIG. 4 and FIG. 5 are graphs showing a change over time of the voltage V and the end-of-discharge voltage VL of the block 1104. FIG. 6 is a graph showing a change over time of the discharge current I of the block 1104.

Prior to a timing TS at which the discharge of the block 1104 is stopped as shown in FIG. 6, the voltage V of the block 1104 is lowered over time, and after the timing TS, the voltage V of the block 1104 is recovered, as shown in FIG. 4 and FIG. 5.

Therefore, in the case where the end-of-discharge voltage VL is corrected without consideration of the polarization resistance RP, the end-of-discharge voltage VL rapidly rises at the timing TS as shown in FIG. 4, which may sometimes cause a situation where although the voltage V of the block 1104 is not below the end-of-discharge voltage VL prior to the timing TS, the voltage V of the block 1104 falls below the end-of-discharge voltage VL after the timing TS.

On the other hand, in the case of correcting the end-of-discharge voltage VL in consideration of the polarization resistance RP, the end-of-discharge voltage VL does not rapidly rise at the timing TS as shown in FIG. 5, and therefore the situation hardly occurs where although the voltage V of the block 1104 is not below the end-of-discharge voltage VL prior to the timing TS, the voltage V of the block 1104 falls below the end-of-discharge voltage VL after the timing TS. That is, a false detection of the end-of-discharge is suppressed.

(Ohmic Resistance Correction Section 1022)

As shown in FIG. 3, the control section 1012 further includes an ohmic resistance correction section 1022 for correcting the ohmic resistance RO. As the equivalent cycle count CY that is derived by an equivalent cycle count deriving section 1028 increases, the ohmic resistance correction section 1022 increases the ohmic resistance RO. As the healthy parallel number NPH that is derived by a healthy parallel number deriving section 1038 decreases, the ohmic resistance correction section 1022 increases the ohmic resistance RO. Here, the "deriving" means a process such as a computation based on a computation formula and a conversion based on a table performed in the built-in computer that executes a control program and a computation performed by an analog computing circuit.

(Equivalent Cycle Count CY)

The equivalent cycle count CY means the number of charge/discharge cycles that causes substantially the same degree of degradation of the blocks 1104 if the discharge having substantially the same capacity as the rated capacity is repeated in each charge/discharge cycle. The equivalent cycle count CY takes a value different from an actual number of charge/discharge cycles, and may take a value other than a natural number.

As the number of charge/discharge cycles increases, the equivalent cycle count CY increases. An increment ΔCY of the equivalent cycle count CY in each of the charge/discharge cycles takes a value of 0 to 1, and the increment ΔCY becomes greater as a discharge depth DD increases. The equivalent cycle count CY reflects the degradation of the block 1104 more appropriately than the number of charge/discharge cycles. Accordingly, if the ohmic resistance RO is corrected based on the equivalent cycle count CY, the ohmic resistance RO is accurately corrected, and therefore the end-of-discharge voltage VL is accurately corrected.

(Healthy Parallel Number NPH)

The healthy parallel number NPH is the number of parallel connections of the strings 1106 by which the same capacity can be obtained in a case where the block 1104 is a parallel-connected unit made up of only healthy strings 1106. The healthy parallel number NPH takes a value different from an actual number NP of parallel connections of the string 1106, and may take a value other than a natural number.

(Relationship Between Equivalent Cycle Count CY and Ohmic Resistance RO)

Figure 7:
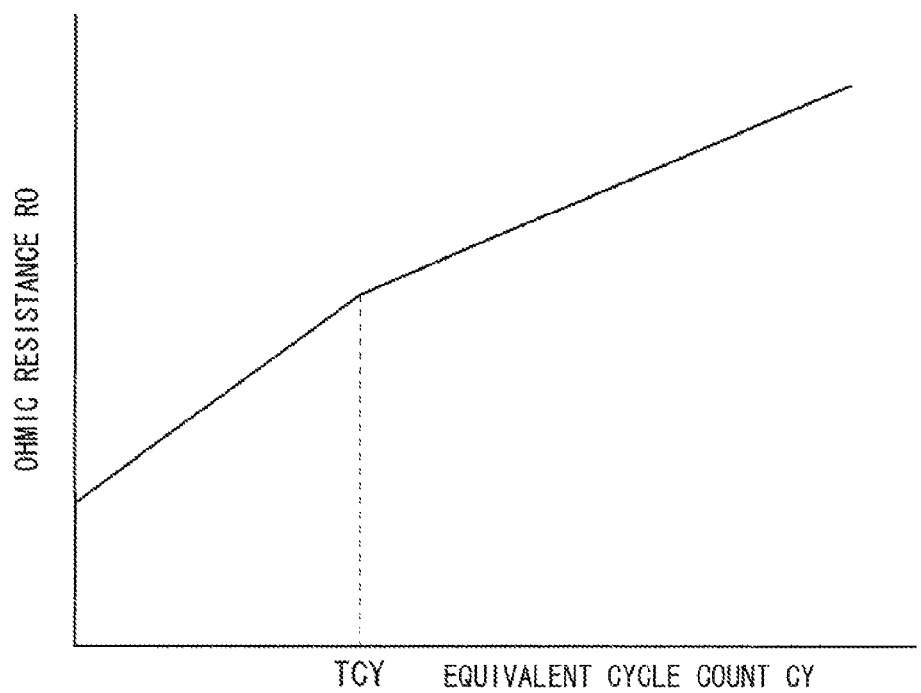
FIG. 7 A graph showing a desired relationship between an equivalent cycle count and an ohmic resistance.

FIG. 7 is a graph showing a desired relationship between the equivalent cycle count CY and the ohmic resistance RO in a case where the healthy parallel number NPH does not change. It is desirable, as shown in FIG. 7, that when the equivalent cycle count CY is above a threshold value TCY, a coefficient dRO/dCY of increase of the ohmic resistance RO relative to the equivalent cycle CY is smaller and in other words, the slope of the graph is more gentle, as compared with when the equivalent cycle count CY falls below the threshold value TCY. If, in this manner, the coefficient dRO/dCY of increase is made smaller as the equivalent cycle count CY increases, the ohmic resistance RO is accurately corrected, and therefore the end-of-discharge voltage VL is accurately corrected. Specific values of the coefficient dRO/dCY of increase and the threshold value TCY depend on specifications of the cell 1108. The coefficient dRO/dCY of increase may be changed in three or more stages, instead of two stages.

(Example of Formula for Correcting Ohmic Resistance RO)

An example of a formula for correcting the ohmic resistance RO will be described. It is to be noted that correction formulas other than the correction formula described herein are adoptable, too.

As shown in the formula (2), the ohmic resistance RO is the sum of the first term and the second term. The first term depends on the equivalent cycle count CY and the healthy parallel number NPH. The second term depends on a temperature TEMP of the module 1102. Set values K1, K2, and K3 depend on specifications of the cell 1108. The temperature TEMP is an actual measured value measured by the temperature measurement section 1008, and is a function of time.

[Math. 2]

$$RO = K1 \times RCN - (TEMP - K2) \times K3 \times \frac{NS}{NP} \quad (2)$$

A variable factor RCN of the first term depending on the equivalent cycle count CY and the healthy parallel number NPH is derived in accordance with the formula (3) if the equivalent cycle count CY is less than the threshold value TCY, and is derived in accordance with the formula (4) if the equivalent cycle count CY is equal to or more than the threshold value TCY. The variable factor RCN is a first-order function of the equivalent cycle count CY, and a minus first-order function of the healthy parallel number NPH. The set values K4, K5, K6, and K7 depend on specifications of the cell 1108. In order that the coefficient dRO/dCY of increase can be smaller when the equivalent cycle count CY is above the threshold value TCY as compared with when the equivalent cycle count CY falls below the threshold value TCY, the set value K7 is set smaller than the set value K5.

[Math. 3]

$$RCN = (K4 + K5 \times CY) \times \frac{NP}{NPH} (CY < TCY) \quad (3)$$

[Math. 4]

$$RCN = \{(K6 + K7 \times (CY - TCY))\} \times \frac{NP}{NPH} (TCY \leq CY) \quad (4)$$

(Device of Equivalent Cycle Count CY)

To derive the equivalent cycle count CY, as shown in FIG. 3, the control section 1012 includes a discharge depth deriving section 1024 for deriving the discharge depth DD of the block 1104 in each charge/discharge cycle, an increment deriving section 1026 for deriving the increment ΔCY of the equivalent cycle count CY in each charge/discharge cycle, and an equivalent cycle count deriving section 1028 for deriving the equivalent cycle count CY.

(Discharge Depth Deriving Section 1024)

In accordance with the formula (5), the discharge depth deriving section 1024 integrates the discharge current I of the block 1104 over time t from a discharge initiation time T0 to a discharge termination time T1, to thereby derive a discharge depth DC that is expressed as a discharged capacity (Ah). To reduce an error, it may be acceptable to stop the integration of the discharge current I when the discharge current I is less than a threshold value.

[Math. 5]

$$DC = \int_{T0}^{T1} I \, dt \quad (5)$$

Additionally, in accordance with the formula (6), the discharge depth deriving section 1024 derives the discharge depth DD that is expressed as the ratio to a rated capacity DCR of the block 1104. This conversion of the expression of the discharge depth is not always necessary.

[Math. 6]

$$DD = \frac{DC}{DCR} \quad (6)$$

(Increment Deriving Section 1026)

The increment deriving section 1026 increases the increment ΔCY of the equivalent cycle count CY as the discharge depth DD derived by the discharge depth deriving section 1024 increases.

(Relationship Between Discharge Depth DD and Increment ΔCY)

Figure 8:
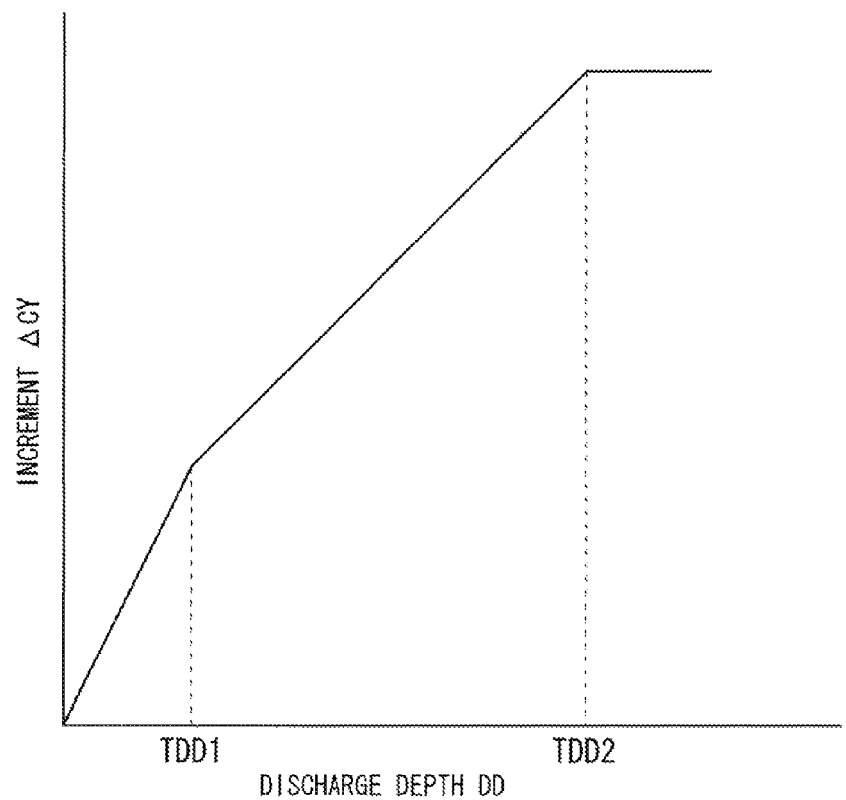
FIG. 8 A graph showing a desired relationship between a discharge depth and an increment of the equivalent cycle count.

FIG. 8 is a graph showing a desired relationship between the discharge depth DD and the increment ΔCY. It is desirable, as shown in FIG. 8, that when the discharge depth DD is above a threshold value TDD1, a coefficient dΔCY/dDD of increase of the increment ΔCY relative to the discharge depth DD is smaller and in other words, the slope of the graph of FIG. 8 is more gentle, as compared with when the discharge depth DD falls below the threshold value TDD1. Moreover, it is desirable that when the discharge depth DD is above a threshold value TDD2 set higher than the threshold value TDD1, the coefficient dΔCY/dDD of increase is further smaller, as compared with when the discharge depth DD falls below the threshold value TDD2. If, in this manner, the coefficient dΔCY/dDD of increase is made smaller as the discharge depth DD increases, the ohmic resistance RO is accurately corrected, and therefore the end-of-discharge voltage VL is accurately corrected. Specific values of the coefficient dΔCY/dDD of increase and the threshold value TDD1 and TDD2 depend on specifications of the cell 1108. The coefficient dΔCY/dDD of increase may be changed in two stages or in four or more stages, instead of three stages.

(Example of Formula for Deriving Increment ΔCY)

An example of a formula for deriving the increment ΔCY will be described. It is to be noted that derivation formulas other than the derivation formula described herein are adoptable, too.

The increment ΔCY is derived in accordance with the formula (7) if the discharge depth DD is less than the threshold value TDD1, and is derived in accordance with the formula (8) if the discharge depth DD is equal to or more than the threshold value TDD1 and less than the threshold value TDD2, and is calculated in accordance with the formula (9) if the discharge depth DD is more than the threshold value TDD2. The set values K8, K9, and K10 depend on specifications of the cell 1108. In order that the coefficient $d\Delta CY/dDD$ of increase can be smaller as the discharge depth DD increases, the set value K10 is set greater than zero and less than the set value K8.

[Math. 7]

$$\Delta CY = K8 \times DD\, (DD < TDD1) \qquad (7)$$

[Math. 8]

$$\Delta CY = K9 + K10 \times DD\, (TDD1 \leq DD < TDD2) \qquad (8)$$

[Math. 9]

$$\Delta CY = 1\, (TDD2 \leq DD) \qquad (9)$$

(Equivalent Cycle Count Deriving Section 1028)

The equivalent cycle count deriving section 1028 adds the increment $\Delta CY$ derived by the increment deriving section 1026, to derive the equivalent cycle count CY. The equivalent cycle count CY(n) in the n-th charge/discharge cycle is derived by adding the increment $\Delta CY(n)$ in the n-th charge/discharge cycle to the equivalent cycle count CY(n−1) in the (n−1)th charge/discharge cycle, in accordance with the formula (10).

[Math. 10]

$$CY(n) = CY(n-1) + \Delta CY(n) \qquad (10)$$

(Derivation of Healthy Parallel Number NPH)

To derive the healthy parallel number NPH, as shown in FIG. 3, the control section 1012 includes: an information holding section 1030 for holding information indicative of the relationship between a discharge depth and an open voltage; a target-block absolute-depth deriving section 1032 for deriving an absolute depth ADS after termination of the discharge of the block 1104 (hereinafter referred to as "target block") whose end-of-discharge voltage VL is to be corrected; a reference-block absolute-depth deriving section 1034 for deriving an absolute depth ADR after termination of the discharge of the block 1104 (hereinafter referred to as "reference block") that serves as the reference of comparison; a ratio deriving section 1036 for deriving a ratio R of the healthy parallel number NPH of the target block to the healthy parallel number NPHR of the reference block; a healthy parallel number deriving section 1038 for deriving the healthy parallel number NPH of the target block; and a reference block selection section 1040 for selecting the reference block. The control section 1012 derives the healthy parallel numbers NPH of all the blocks 1104 in each charge/discharge cycle.

(Information Held by Information Holding Section 1030)

The information holding section 1030 holds information indicative of the relationship between the open voltage of the block 1104 and the discharge depth of the cell 1108 included in the block 1104. The discharge depth is expressed by the discharged capacity (Ah). The information may be held in the form of a numerical value table, or may be held in the form of a computation formula.

Figure 9:
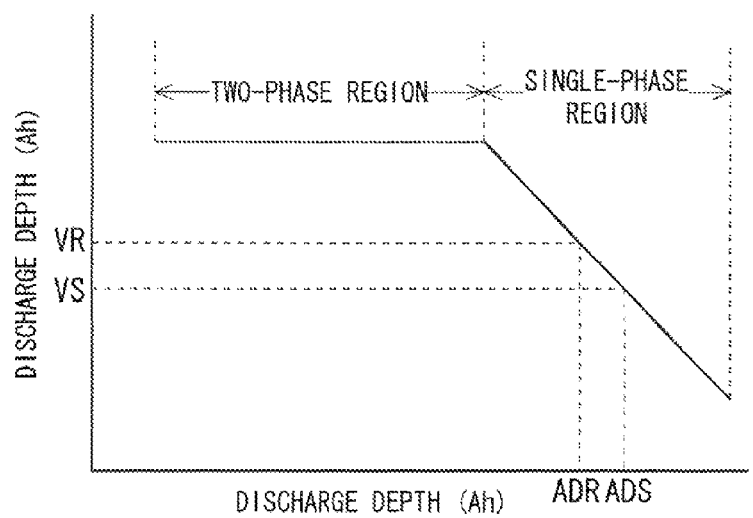
FIG. 9 A diagram showing a relationship between an open voltage of a block and a discharge depth of a cell included in the block.

FIG. 9 is a diagram showing, in the form of a graph, the information held by the information holding section 1030 and indicative of the relationship between the open voltage of the block 1104 and the discharge depth of the cell 1108 included in the block 1104.

As shown in FIG. 9, in the sodium-sulfur battery, in a two-phase region containing sodium sulfide ($Na_2S_5$) and elemental sulfur (S) as a positive-electrode active material, the open voltage is almost constant even when the discharge depth increases. On the other hand, in a single-phase region containing only sodium sulfide ($Na_2S_x$) as the positive-electrode active material, the open voltage is reduced when the discharge depth increases. Therefore, if the open voltage of the block 1104 after termination of the discharge is known, the absolute depth of the block 1104 can be derived by referring to the information indicative of the relationship between the open voltage of the block 1104 and the discharge depth of the cell 1108 included in the block 1104.

(Absolute Depth)

The "absolute depth" of the block 1104 indicates a position on the horizontal axis of the graph of FIG. 9 at which the cell 1108 belonging to the healthy string 1106 included in the block 1104 is placed. Therefore, even if the capacity discharged by the block 1104 is constant, the absolute depth of the block 1104 is smaller (the graph of FIG. 9 is shifted to the left) if the healthy parallel number NPH increases, while the absolute depth of the block 1104 is greater (the graph of FIG. 9 is shifted to the right) if the healthy parallel number NPH decreases. This means that the healthy parallel number NPH can be known from the absolute depths after termination of discharge of the target block and the reference block whose actual discharged capacities from initiation of the discharge to termination of the discharge are equal to each other, that is, the target block and the reference block being connected in series with each other.

The information indicative of the relationship between the open voltage of the block 1104 and the discharge depth of the cell 1108 included in the block 1104 is determined depending on specifications of the cell 1108, and does not depend on the healthy parallel number NPH.

In the above description, the information indicative of the relationship between the open voltage of the block 1104 and the discharge depth of the cell 1108 included in the block 1104 is used. Here, information indicative of the relationship between the open voltage of the block 1104 and the discharge depth of the block 1104 may be used. This is because the information indicative of the relationship between the open voltage of the block 1104 and the discharge depth of the block 1104 is expressed merely as a graph that is obtained by multiplying the graph of FIG. 9 by the number NP of parallel-connected strings 1106 in the direction of the horizontal axis. Needless to say, in a case of using the information indicative of the relationship between the open voltage of the block 1104 and the discharge depth of the block 1104, in order to derive the absolute depths of the target block and the reference block, it is necessary to refer to the same information indicative of the relationship between the open voltage of the block 1104 and the discharge depth of the block 1104, even if the healthy parallel number NPH is actually different between the target block and the reference block.

(Target-Block Absolute-Depth Deriving Section 1032)

The target-block absolute-depth deriving section 1032 refers to the information held by the information holding section 1030, and derives, as the absolute depth ADS, the discharge depth of the target block corresponding to the open voltage VS after termination of the discharge of the target block, as shown in FIG. 9. The "open voltage after termination of the discharge" may be an actual measured value obtained by an actual measurement performed after an adequate time period elapses since the termination of the discharge, or may be an estimated value estimated based on how the open voltage varies after the termination of the discharge.

(Reference-Block Absolute-Depth Deriving Section 1034)

The reference-block absolute-depth deriving section 1034 refers to the information held by the information holding section 1030, and derives, as the absolute depth ADR, the discharge depth of the target block corresponding to the open voltage VR after termination of the discharge of the reference block, as shown in FIG. 9. Similarly, the "open voltage after termination of the discharge" may be an actual measured value, or may be an estimated value.

The information referred to by the reference-block absolute-depth deriving section 1034 is the same as the information referred to by the target-block absolute-depth deriving section 1032. Since the target block and the reference block are connected in series with each other, a capacity (hereinafter referred to as "use capacity") DC that is actually discharged by the block 1104 from initiation of the discharge to termination of the discharge is equal between the target block and the reference block. Accordingly, in a case where the healthy parallel number NPH of the target block is smaller than that of the reference block, as shown in FIG. 9, the open voltage VS after termination of the discharge of the target block is lower than the open voltage VR after termination of the discharge of the reference block, and the absolute depth ADS derived by the target-block absolute-depth deriving section 1032 is greater than the absolute depth ADR derived by the reference-block absolute-depth deriving section 1034.

(Ratio Deriving Section 1036)

The ratio deriving section 1036 derives a capacity CPS of the target block that is discharged by the target block until the absolute depth ADR is reached in a case where it is assumed that the healthy parallel number NPH of the target block is equal to the healthy parallel number NPHR of the reference block. The capacity CPS of the target block is, for example, the sum DC+(ADS−ADR)×NPHR(n−1) of the use capacity DC and a capacity difference (ADS−ADR)×NPHR(n−1) that is obtained by multiplying a difference ADS−ADR between the absolute depth ADS and the absolute depth ADR by the healthy parallel number NPHR(n−1) of the reference block having been derived in the previous charge/discharge cycle. In a case of using the information indicative of the relationship between the open voltage of the block 1104 and the discharge depth of the block 1104, the multiplication by the healthy parallel number NPHR(n−1) of the reference block is not necessary.

The ratio deriving section 1036 derives a capacity CPR of the reference block that is discharged by the reference block from initiation of the discharge until the absolute depth ADR is reached. The capacity CPR of the reference block is, for example, the use capacity DC.

Furthermore, the ratio deriving section 1036 derives the ratio R of the capacity CPR of the reference block to the capacity CPS of the target block, in accordance with the formula (11).

[Math. 11]

$$R = \frac{CPR}{CPS} = \frac{DC}{DC + (ADS - ADR) \times NPHR(n-1)} \quad (11)$$

Additionally, in accordance with the formula (12), the ratio deriving section 1036 multiplies by the derived ratio R the healthy parallel number NPHR(n−1) of the reference block having been derived in the previous charge/discharge cycle, to thereby derive the healthy parallel number NPH(n) of the target block in the current charge/discharge cycle.

[Math. 12]

$$NPH(n) = R \times NPHR(n-1) \quad (12)$$

(Reference Block Selection Section 1040)

The reference block selection section 1040 selects a less degraded block 1104 as the reference block. For example, the reference block selection section 1040 sets, as the reference block, one block 1104 whose healthy parallel number NPH, which has been derived in the immediately preceding charge/discharge cycle, is the largest. Alternatively, the reference block selection section 1040 sets, as the reference block, one block 1104 selected from at least two blocks 1104 whose healthy parallel numbers NPH, which have been derived in the immediately preceding charge/discharge cycle, are relatively large.

In the following, as an example, a case will be described in which one block 1104 is selected as the reference block from a first block 1104 whose healthy parallel number NPH derived in the immediately preceding charge/discharge cycle is the largest and a second block 1104 whose healthy parallel number NPH derived in the immediately preceding charge/discharge cycle is the second largest. If the healthy parallel numbers NPH having been derived in the immediately preceding charge/discharge cycle are equal and therefore it is impossible to rank the blocks 1104 in descending order of the healthy parallel number NPH, it is desirable to rank the blocks 1104 having the equal healthy parallel numbers NPH in descending order of the open voltage obtained after termination of the discharge.

For the selection of the reference block, firstly, the first block 1104 is set as a provisional reference block, and a provisional healthy parallel number NPH of the second block 1104 is derived. The derivation of the provisional healthy parallel number NPH of the second block 1104 may be performed by employing the foregoing formulas (11) and (12) with considering the first block 1104 as the reference block and the second block 1104 as the target block. However, instead of the formula (11), it is desirable to use the formula (13) in which a parameter ADP is further introduced for suppressing a determination that the first block 1104 is degraded.

[Math. 13]

$$R = \frac{DC}{DC + (ADS + ADP - ADR) \times NPHR(n-1)} \quad (13)$$

The provisional healthy parallel number NPH of the second block 1104 that is derived in accordance with the formulas (12) and (13) is compared with the healthy parallel number NPH of the second block 1104 that has been derived in the immediately preceding charge/discharge cycle. If the former is increased as compared with the latter, the second block 1104 is set as the reference block, and if the former is not increased as compared with the latter, the first block 1104 is set as the reference block.

This enables selection of an appropriate reference block, and thus the ohmic resistance can be corrected more accurately.

(Others)

While the invention has been described in detail, the foregoing description is in all aspects illustrative and not restrictive. It is therefore understood that numerous modifications and variations not illustrated herein can be devised without departing from the scope of the invention.

The invention claimed is:

1. An end-of-discharge voltage correction device for correcting an end-of-discharge voltage of a first parallel-connected unit in which sodium-sulfur battery cells or series-connected units each including series-connected cells are connected in parallel with one another, said end-of-discharge voltage correction device comprising:

a discharge depth deriving section for deriving a discharge depth of the first parallel-connected unit in each charge/discharge cycle;

an increment deriving section for deriving an increment of an equivalent cycle count in each charge/discharge cycle, said increment becoming greater as the discharge depth derived by said discharge depth deriving section increases;

an equivalent cycle count deriving section for deriving the equivalent cycle count by adding the increment derived by said increment deriving section;

an information holding section for holding information indicative of a relationship between an open voltage and a discharge depth;

a first absolute depth deriving section for, with reference to the information held by said information holding section, deriving, as an absolute depth, a discharge depth of the first parallel-connected unit corresponding to an open voltage after termination of discharge of the first parallel-connected unit;

a second absolute depth deriving section for, with reference to the information held by said information holding section and referred to by said first absolute depth deriving section, deriving, as an absolute depth, a discharge depth of a second parallel-connected unit corresponding to an open voltage after termination of discharge of said second parallel-connected unit, said second parallel-connected unit being connected in series with the first parallel-connected unit;

a ratio deriving section for deriving the ratio of a capacity discharged by the second parallel-connected unit from initiation of the discharge until the absolute depth derived by said second absolute depth deriving section is reached with respect to a capacity discharged by the first parallel-connected unit from initiation of the discharge until the absolute depth derived by said first absolute depth deriving section is reached, in a case where it is assumed that a healthy parallel number of the first parallel-connected unit is equal to a healthy parallel number of the second parallel-connected unit;

a healthy parallel number deriving section for deriving the healthy parallel number of the first parallel-connected unit by multiplying the healthy parallel number of the second parallel-connected unit by the ratio derived by said ratio deriving section;

an ohmic resistance correction section for increasing an estimated value of an ohmic resistance of the first parallel-connected unit as the equivalent cycle count derived by said equivalent cycle count deriving section increases, while increasing the estimated value of the ohmic resistance of the first parallel-connected unit as the healthy parallel number derived by said healthy parallel number deriving section decreases; and an end-of-discharge voltage correction section for: subtracting, from an end-of-discharge open voltage, the product of a discharge current of the first parallel-connected unit and the estimated value of the ohmic resistance of the first parallel-connected unit corrected by said ohmic resistance correction section and the product of the discharge current of the first parallel-connected unit having a time delay process performed thereon and a polarization resistance of the first parallel-connected unit; and setting a resulting value as an end-of-discharge voltage.

2. The end-of-discharge voltage correction device according to claim 1, wherein
said increment deriving section reduces a coefficient of increase of the increment relative to the discharge depth as the discharge depth derived by said discharge depth deriving section increases.

3. The end-of-discharge voltage correction device according to claim 1, wherein
said ohmic resistance correction section reduces a coefficient of increase of the estimated value of the ohmic resistance relative to the equivalent cycle count as the equivalent cycle count derived by said equivalent cycle count deriving section increases.

4. The end-of-discharge voltage correction device according to claim 2, wherein
said ohmic resistance correction section reduces a coefficient of increase of the estimated value of the ohmic resistance relative to the equivalent cycle count as the equivalent cycle count derived by said equivalent cycle count deriving section increases.

5. An end-of-discharge voltage correction method for correcting an end-of-discharge voltage of a first parallel-connected unit in which sodium-sulfur battery cells or series-connected units each including series-connected cells are connected in parallel with one another, said method comprising the steps of:

(a) deriving a discharge depth of the first parallel-connected unit in each charge/discharge cycle;

(b) deriving an increment of an equivalent cycle count in each charge/discharge cycle, said increment becoming greater as the discharge depth derived in said step (a) increases;

(c) deriving the equivalent cycle count by adding the increment derived in said step (b);

(d) with reference to information indicative of a relationship between an open voltage and a discharge depth, deriving, as an absolute depth, a discharge depth of the first parallel-connected unit corresponding to an open voltage after termination of discharge of the first parallel-connected unit;

(e) with reference to the information referred to in said step (d), deriving, as an absolute depth, a discharge depth of a second parallel-connected unit corresponding to an open voltage after termination of discharge of said second parallel-connected unit, said second parallel-connected unit being connected in series with the first parallel-connected unit;

(f) deriving the ratio of a capacity discharged by the second parallel-connected unit from initiation of the discharge until the absolute depth derived in said step (e) is reached with respect to a capacity discharged by the first parallel-connected unit from initiation of the discharge until the absolute depth derived in said step (d) is reached, in a case where it is assumed that a healthy parallel number of the first parallel-connected unit is equal to a healthy parallel number of the second parallel-connected unit;

(g) deriving the healthy parallel number of the first parallel-connected unit by multiplying the healthy parallel number of the second parallel-connected unit by the ratio derived in said step (f);

(h) increasing an estimated value of an ohmic resistance of the first parallel-connected unit as the equivalent cycle count derived in said step (c) increases, while increasing the estimated value of the ohmic resistance of the first parallel-connected unit as the healthy parallel number derived in said step (g) decreases; and (i) subtracting, from an end-of-discharge open voltage, the product of a discharge current of the first parallel-connected unit and the estimated value of the ohmic resistance of the first parallel-connected unit corrected in said step (g) and the product of the discharge current of the first parallel-connected unit having a time delay process performed thereon and a polarization resistance of the first parallel-connected unit; and setting a resulting value as an end-of-discharge voltage.

\* \* \* \* \*